(12) United States Patent
Jang et al.

(10) Patent No.: US 9,053,676 B2
(45) Date of Patent: Jun. 9, 2015

(54) DISPLAY DEVICE AND METHOD OF FABRICATING THE SAME

(75) Inventors: Yong Ho Jang, Gyeonggi-do (KR); Seung Chan Choi, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 1292 days.

(21) Appl. No.: 11/808,989

(22) Filed: Jun. 14, 2007

(65) Prior Publication Data

US 2007/0290967 A1  Dec. 20, 2007

(30) Foreign Application Priority Data

Jun. 16, 2006 (KR) .................. 10-2006-0054481

(51) Int. Cl.
*G02F 1/1345* (2006.01)
*G09G 3/36* (2006.01)
*G02F 1/1362* (2006.01)
*H01L 27/12* (2006.01)

(52) U.S. Cl.
CPC ...... *G09G 3/3677* (2013.01); *G09G 2300/0408* (2013.01); *G09G 2300/0426* (2013.01); *G09G 2310/0286* (2013.01); *G02F 1/136286* (2013.01); *G02F 2001/136263* (2013.01); *G02F 2001/13629* (2013.01); *H01L 27/124* (2013.01)

(58) Field of Classification Search
CPC  G02F 1/13452; G02F 1/1345; G02F 1/13458

USPC .................................................. 349/149–152
See application file for complete search history.

(56) References Cited

U.S. PATENT DOCUMENTS

| 5,063,378 A | 11/1991 | Roach |
| 6,215,541 B1 | 4/2001 | Song et al. |
| 7,286,202 B2 * | 10/2007 | Yamaguchi et al. ......... 349/152 |
| 2006/0139551 A1 * | 6/2006 | Kimura ......................... 349/149 |
| 2008/0198108 A1 * | 8/2008 | Aoki .............................. 345/87 |

FOREIGN PATENT DOCUMENTS

JP          08062626 A      3/1996

OTHER PUBLICATIONS

Korean Office Action, dated Aug. 24, 2012.
Preliminary Search Report dated Oct. 10, 2012 issued by the French Patent Office for a counterpart French patent application No. FR0704067.

* cited by examiner

*Primary Examiner* — Dung Nguyen
(74) *Attorney, Agent, or Firm* — Morgan, Lewis & Bockius LLP (57) ABSTRACT

A display device includes a substrate with a display area having gate lines and data lines defining cells that each has a pixel electrode, a driving circuit on the substrate, at least one first signal line including lower and upper lines overlapping each other with an insulation layer interposed therebetween, the first signal line adjacent to the driving circuit, and at least one second signal line to connect the first signal line to the driving circuit.

9 Claims, 6 Drawing Sheets

DISPLAY DEVICE AND METHOD OF FABRICATING THE SAME

This application claims the benefit of Korean Patent Application No. 10-2006-54481 filed on Jun. 16, 2006, which is hereby incorporated by reference in its entirety.

BACKGROUND OF THE INVENTION

1. Field of the Invention

Embodiments of the present invention relates to signal lines, and more particularly, to signal lines in a display device and a method of fabricating the same. Although embodiments of the invention are suitable for a wide scope of applications, it is particularly suitable for improving the output properties of a display and for preventing defects caused by a disconnected signal line

2. Discussion of the Related Art

Generally, a liquid crystal display (LCD) device displays images by controlling light transmittance through liquid crystal. The LCD device includes an LCD panel having a plurality of pixel regions arranged in a matrix configuration, and a driving circuit the drives the LCD panel. The driving circuit includes a gate driver to drive gate lines, a data driver to drive data lines, and a timing controller to control the gate and data drivers.

The gate driver includes a shift register to output scan pulses in sequence. The shift register includes a plurality of stages cascaded one after another such that the plurality of stages sequentially output the scan pulses to scan the gate lines of LCD panel in sequence. At least one of a plurality of clock pulses having sequential phase differences is applied to the plurality of stages. Accordingly, the shift register needs a plurality of signal lines supplying the clock pulses. However, if the shift register is formed on a thin film transistor (TFT) array substrate of the LCD panel, the plurality of signal lines are formed on the TFT array substrate.

When forming the signal lines on the substrate, the signal lines are formed of the same metal material as the gate or data lines with a width of several micrometers (μm) so as not to affect the resolution of the display. Since the signal line is formed in a single line, the signal line has a small cross-sectional area. Thus, when transmitting an electric signal to the shift register through the signal line, resistance is large due to the small cross-sectional area of signal line. The resistance degrades the electric signal such that the output signal from the shift register is deteriorated. Further, the signal line can easily become disconnected during fabrication, which increases the defect ratio of the display device.

SUMMARY OF THE INVENTION

Accordingly, embodiments of the present invention are directed to a display device and a method of fabricating the same that substantially obviate one or more problems due to limitations and disadvantages of the related art.

An object of embodiments of the present invention is to provide a display device having improved signal distribution and prevents defects caused by a disconnected signal line, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a substrate with a display area having gate lines and data lines defining cells that each has a pixel electrode, a driving circuit on the substrate, at least one first signal line including lower and upper lines overlapping each other with an insulation layer interposed therebetween, the first signal line adjacent to the driving circuit, and at least one second signal line to connect the first signal line to the driving circuit.

In another aspect, a display device includes a substrate with a display area having gate lines and data lines defining cells that each has a pixel electrode, a driving circuit on the substrate, at least one first signal line including a lower lines and an upper line overlapping each other with an insulation layer interposed therebetween, the upper line having an opening between portions of the upper line, and at least one second signal line crossing the lower line in the opening of the upper line to connect to the driving circuit.

In another aspect, a method of fabricating a display device a method of fabricating a display device with a display area on a substrate having gate lines and data lines defining cells that each has a pixel electrode includes forming at least one first signal line including lower and upper lines overlapping each other with a first insulation layer interposed therebetween, and forming at least one second signal line directly connected to the upper line and electrically connected to a driving circuit on the substrate.

In yet another aspect, a method of fabricating a display device with a display area on a substrate having gate lines and data lines defining cells that each have a pixel electrode includes forming at least one first signal line including a lower lines and an upper line overlapping each other with an insulation layer interposed therebetween, the upper line having a predetermined opening between portions of the upper line, and forming at least one second signal line crossing the lower line in the opening of the upper line to connect to the driving circuit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts. Hereinafter, an LCD device according to the preferred embodiments of the present invention and a method of fabricating the same will be described with reference to the accompanying drawings.

Figure 1:
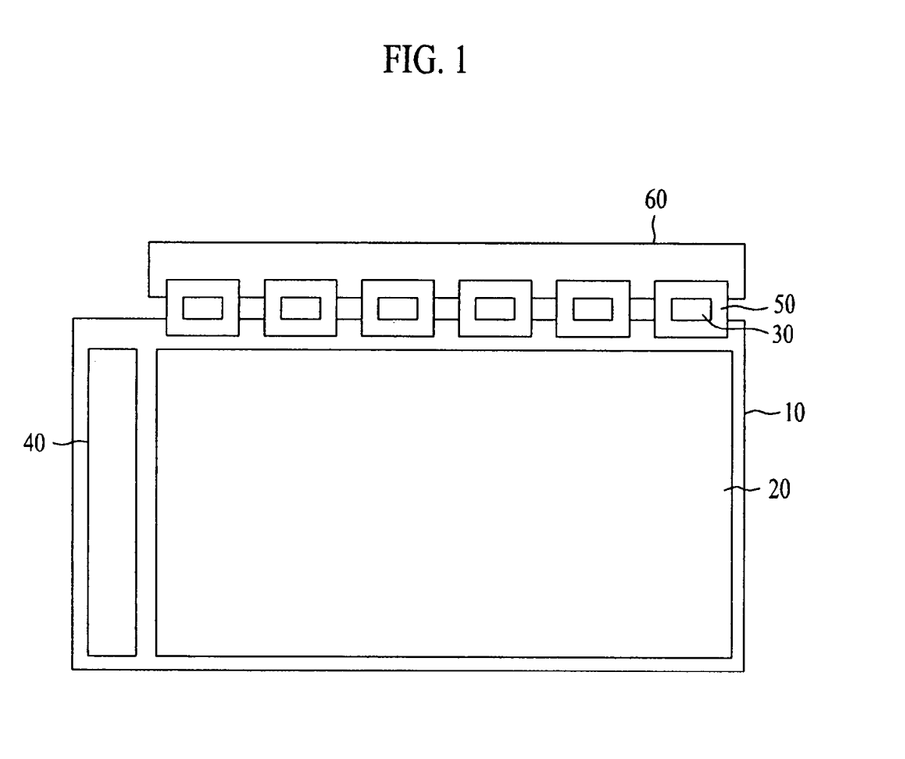
FIG. 1 is a schematic view of illustrating an LCD device according to an embodiment of the present invention.

FIG. 1 is a schematic view of illustrating an LCD device according to an embodiment of the present invention. As shown in FIG. 1, the LCD device includes an LCD panel 20 that has a plurality of gate and data lines (not shown) formed on a TFT array substrate 10; data drivers 30 to drive the plurality of data lines (not shown) and a gate driver 40 which drives the plurality of gate lines (not shown). The gate driver 40 is on the substrate 10 of the LCD panel and the data drivers 30 are on a plurality of data circuit films 50 connected between the substrate 10 and a printed circuit board (PCB) 60.

The LCD panel 20 includes a thin film transistor (TFT) in each of pixel regions defined by the plurality of gate and data lines; and a pixel electrode which drives liquid crystal molecules. The thin film transistor (TFT) supplies a data signal of the data line to the pixel electrode in response to a scan pulse of the gate line. The data driver 30 converts digital video data from the external into analog video data, and then supplies the analog video data for one horizontal line to the data line every horizontal period. That is, the data driver 30 selects a gamma voltage having a predetermined level based on a gray scale value of analog video data, and then supplies the selected gamma voltage to the data lines.

The gate driver 40 includes a shift register that sequentially generates scan pulses. In response to the scan pulse, the thin film transistor (TFT) is turned-on. Such a shift register of the gate driver 40 is formed on and integrated with the TFT array substrate 10.

Figure 2:
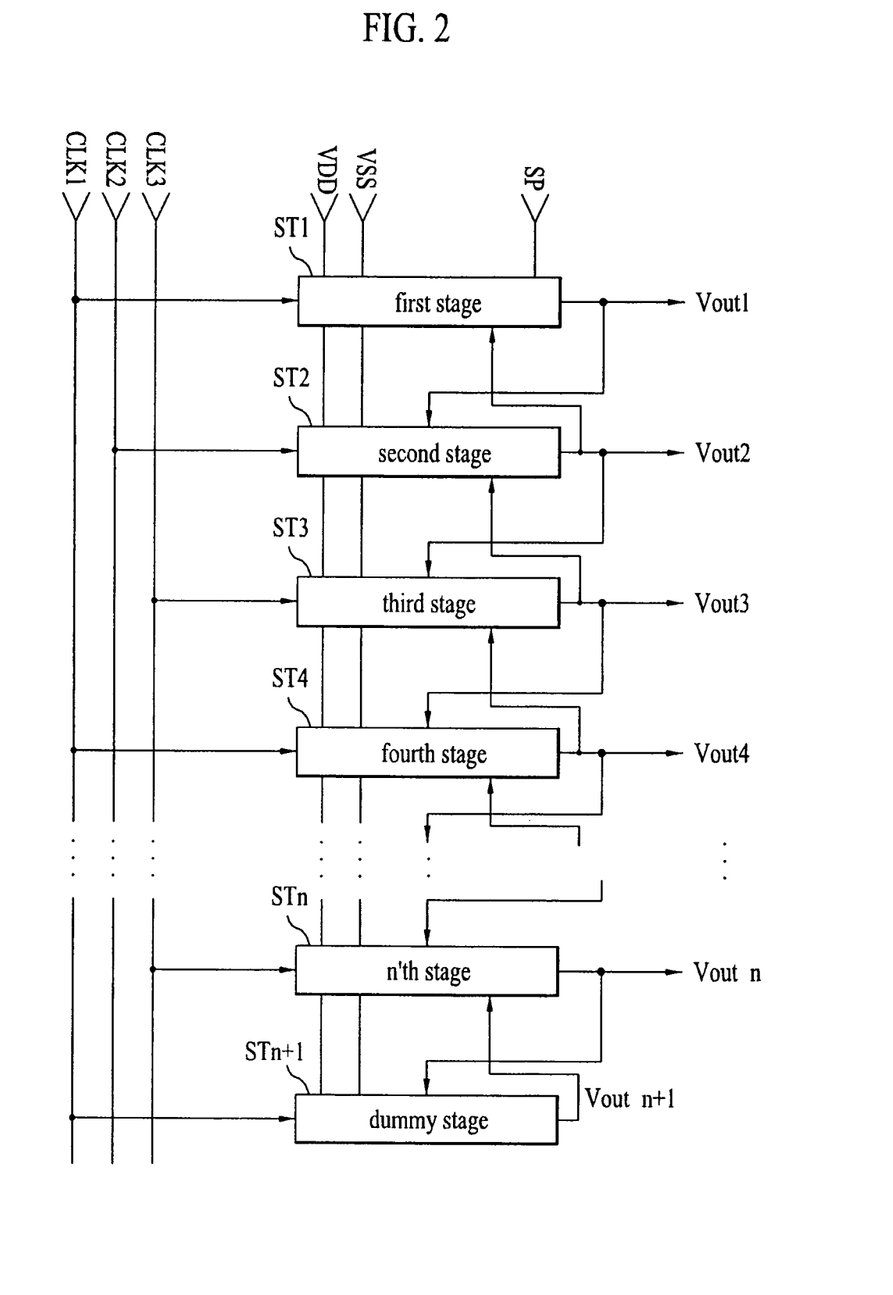
FIG. 2 is a schematic view of illustrating a shift register included in a gate driver of FIG. 1.

FIG. 2 is a schematic view of illustrating the shift register included in the gate driver of FIG. 1. As shown in FIG. 2, the shift register includes 'n' stages (ST1 to STn) cascaded one after another and one dummy stage (STn+1). The 'n' stages (ST1 to STn) and one dummy stage (STn+1) output the scan pulses (Vout1 to Voutn+1) in sequence. At this time, the scan pulses (Vout1 to Voutn+1) outputted from the 'n' stages (ST1 to STn) are sequentially supplied to the gate lines so that the gate lines are scanned in sequence.

The 'n+1' stages (ST1 to STn+1) are supplied with first and second driving voltages in common. Also, the 'n+1' stages (ST1 to STn+1) are supplied with a plurality of clock pulses, for example, at least one of first to third clock pulses (CLK1 to CLK3). A plurality of signal lines are formed adjacent to the shift register and are connected to the shift register to supply clock pulses and driving voltages. More specifically, the signal lines are formed in a dual conductive-layer structure by interposing an insulation layer between a lower conductive-layer and an upper conductive-layer. The lower and upper conductive-layers are connected in parallel so that a signal line resistance can be decreased and signal line disconnection can be prevented.

The first stage (ST1) can be supplied with a start pulse (SP) while the second to dummy stages (ST2 to STn+1) are supplied with the output signals of preceding stages in sequence such that output signals of preceding stages function as trigger signals. Also, the first to 'n' stages (ST1 to STn) can be supplied with the output signals of next stages as reset signals. The first driving voltage (VDD) is a gate-on voltage (VGON), and the second driving voltage (VSS) is a gate-off voltage (VGOFF).

Figure 3A:
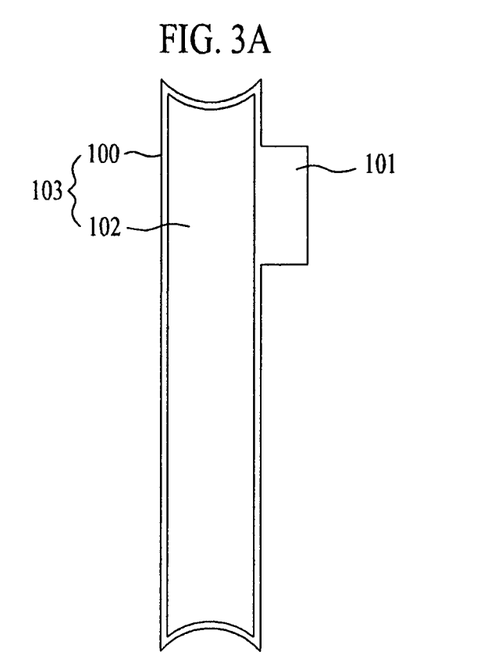
FIGS. 3A to 3C are plan views of illustrating various signal lines of FIG. 2.
Figure 3B:
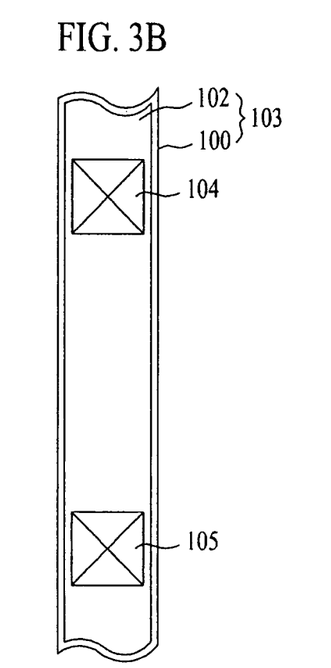
Figure 3C:
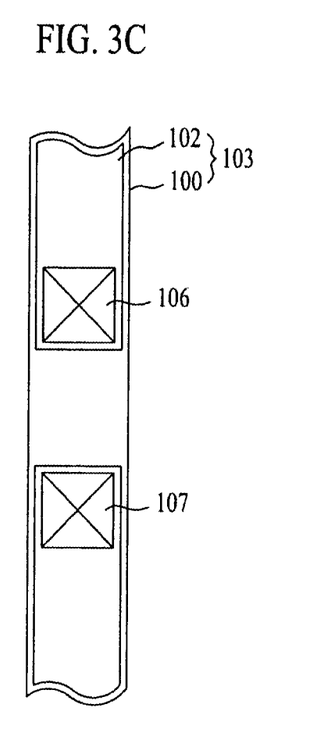

FIGS. 3A to 3C are plan views of illustrating the various signal lines of FIG. 2 according to an embodiment of the present invention. As shown in FIG. 3A, the signal line 103 has a lower line 100 and an upper line 102 in which the lower line 100 is formed on the substrate (not shown), and the upper line 102 overlaps the lower line 100. An insulation layer (not shown) is interposed between the lower line 100 and the upper line 102. Further, the lower line 100 includes a projection 101 extending from the side of the lower line 100.

The lower line 100 can be formed of the same metal material as the gate line in the display area of the LCD panel. The gate metal layer can be formed on the substrate by sputtering, and then patterned by photolithography and etching, thereby forming both the gate line and the lower line 100. In addition, the projection 101 can also be formed from the lower line 100 by the same sputtering, patterning and etching processes.

Each of the gate line and the lower line 100 has a thickness of about 2000 Å. Also, the gate line and the lower line 100 can be formed of aluminum (Al), aluminum neodymium (AlNd), molybdenum (Mo), tungsten (W), titanium (Ti), or chrome (Cr). Further, each of the gate line and the lower line 100 can be formed as a single-layered line or a multi-layered line.

Although not shown, the insulation layer is formed over an entire surface of the substrate, including the lower line 100 and the gate line. The insulation layer can be formed of an inorganic insulation material, such as silicon nitride (SiN) or silicon oxide ($SiO_2$).

The upper line 102 and the data line of display area are formed of the same metal material. As mentioned above, the upper line 102 is formed over the lower line 100. More specifically, a data metal layer is formed on the substrate by sputtering, patterned by photolithography and etched, thereby forming the data line and the upper line 102. Although not shown, a projection can be formed from the upper line 102. Each of the data line and the upper line 102 has a thickness of about 3000 Å. Also, the data line and the upper line 102 can be formed of one of aluminum (Al), aluminum neodymium (AlNd), molybdenum (Mo), tungsten (W), titanium (Ti), and chrome (Cr). Further, the data line and the upper line 102 can be formed as a single-layered line or multi-layered line, such as a metal line with a silicide layer. In the alternative, the upper line 102 can be formed of a transparent conductive material like the pixel electrode of display area. But, in a transflective (transmitting-reflective) type display device, the upper line 102 can be alternatively formed of a reflective metal material, which is the same as a reflective electrode.

As shown in FIG. 3B, the signal line 103 can include a lower line 100 and an upper line 102, wherein the lower line 100 is formed on the substrate (not shown) and the upper line 102 overlaps the lower line 100. An insulation layer can be positioned between the lower line 100 and the upper line 102, which overlap each other. In addition, a plurality of contact points 104 and 105 are provided to electrically connect the lower and upper lines 100 and 102 to each other.

The lower and upper lines 100 and 102 are electrically connected to each other at the plurality of contact points 104 and 105 through contact holes in the insulation layer. Accordingly, a signal line 103 having a dual-layered structure including the lower and upper lines 100 and 102 is formed with a thickness of about 5000 Å such that the resistance of the signal line is lowered due to an increase in the size of the cross-section of the signal line at least along a portion of the signal line 103.

The resistance of signal line changes inversely to the size of the cross-section of the signal line as well as environmental conditions, such as temperature or atmospheric pressure. Because the resistance of signal line is in inversely proportion to the size of the cross-section of the signal line, signal output properties are improved due to the increased cross-sectional size of the signal line 103. Even though one of the lower line 100 or upper line 102 may be disconnected during the process of forming the signal line 103, there is no electrical disconnection of device due to the plurality of contact points between the lower line 100 or upper line 102. Thus, a defect ratio of a display device can be decreased.

As shown in FIG. 3C, the first signal line 103 includes a lower line 100 and an upper line 102 in which the lower line 100 is formed on the substrate (not shown) and the upper line 102 overlaps the upper line 102 with an insulation layer (not shown) therebetween. The upper line 102 has a predetermined opening between portions of the upper line 102. Adjacent to the opening, contact points 106 and 107 are formed at the ends of the portions of the upper line 102 through which the lower line 100 is electrically connected to the portions of the upper line 102. The portions of upper line 102 can be formed by photolithography and etching during the process of forming the upper line 102. Another second signal line (not shown) can cross the first signal line 103 through the opening of the upper line 102 without increasing the height of the second signal line above the first signal line 103.

Figure 4A:
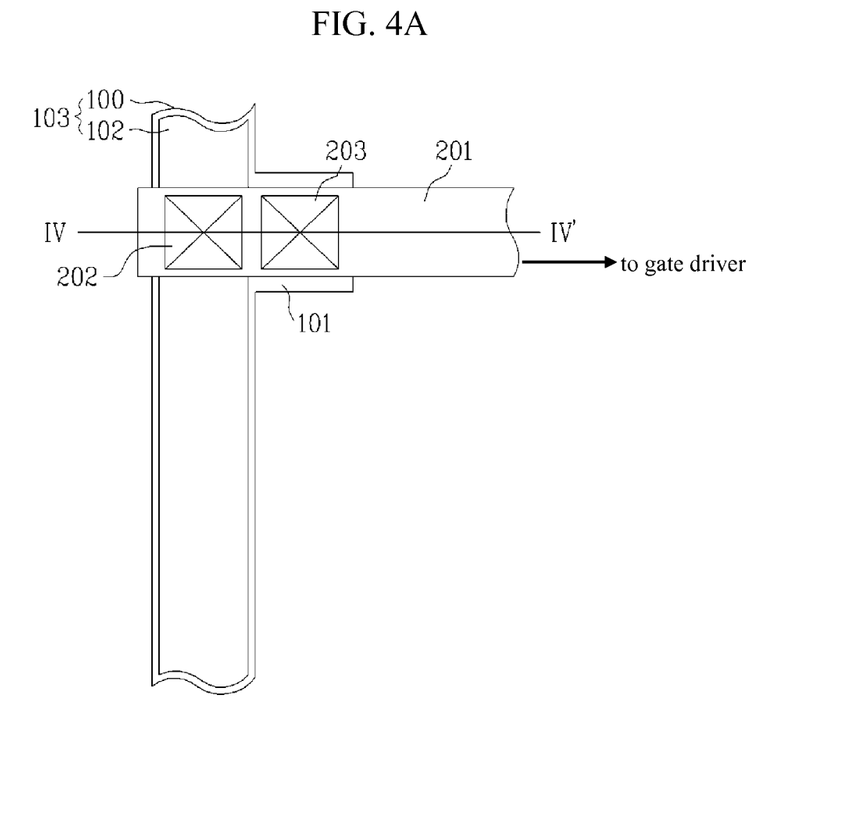
FIG. 4A is a plan view of illustrating a contact structure of signal lines according to an embodiment of the present invention.
Figure 4B:
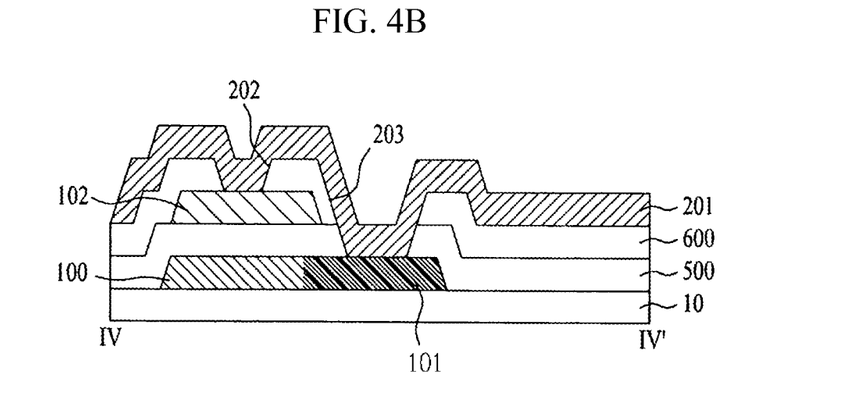
FIG. 4B is a cross-sectional view of signal lines along line IV-IV' of FIG. 4A.

FIG. 4A is a plan view of illustrating a contact structure of signal lines according to an embodiment of the present invention. FIG. 4B is a cross-sectional view of signal lines along line IV-IV' of FIG. 4A. As shown in FIGS. 4A and 4B, a first signal line 103 is formed of lower and upper lines 100 and 102 overlapping each other with an insulation layer 500 interposed therebetween. Further, the lower line 100 of the first signal line 103 includes a projection 101 extending from the side of the first signal line. The second signal line 201 is orthogonal to the first signal line 103 with a second insulation layer 600 therebetween. More specifically, the second signal line 201 is connected to the first signal line 103 through a contact structure having a first contact hole 202 in the second insulation layer 600 and through a second contact hole 203 in the first and second insulation layers 500 and 600. By such a contact structure, the first signal line 103 is electrically connected to a gate driver (e.g., the gate driver 40 of the FIG. 1 example) through the second signal line 201.

The second signal line 201 directly connects to the upper line 102 of the first signal line 103 by a first contact hole 202 passing through the first and second insulation layers 50 600. Also, the second signal line 201 directly connects to the projection 101 from the lower line 100 of the first signal line 103 by a second contact hole 203 passing through the first and second insulation layers 500 and 600. Accordingly, the second signal line 201 connects the lower and upper lines 100 and 102 of the first signal line 103 in parallel. Through the first and second contact holes 202 and 203, a contact area between the first and second signal lines 103 and 201 is greater than through a single contact hole of the related art single line. Thus, such a double contact structure improves the signal transmission output properties of the signal lines 103 and 201.

A method of forming the signal line according to an embodiment of the present invention will be explained with reference to FIG. 4B. First, a gate metal layer corresponding to a first conductive layer is deposited on the substrate 10 by sputtering, patterned by photolithography and etched, thereby forming the lower, line 100 and the projection 101 as one body.

Then, a gate insulation layer corresponding to a first insulation layer 500 is formed on the substrate 10 by plasma enhanced chemical vapor deposition (PECVD) to cover the lower line 100. The first insulation layer 500 is formed of an inorganic insulation material, such as silicon nitride (SiN), silicon oxide ($SiO_2$), or an organic insulation material.

Next, a data metal layer corresponding to a second conductive layer is deposited on the first insulation layer 500 by sputtering, patterned by photolithography and etched, thereby forming the upper line 102 overlapping the lower line 100.

Then, a passivation layer corresponding to a second insulation layer 600 is formed on the substrate 10 by a deposition method of PECVD or a spinless coating method to cover the upper line 102. Subsequently, the second insulation layer 600 is patterned by photolithography and then the first and second insulation layers 500 and 600 are etched, thereby forming the first and second contact holes 202 and 203 to expose the projection 101 and predetermined portions of the upper line 102. The second insulation layer 600 is formed of an inorganic insulation material, such as silicon nitride (SiN) or silicon oxide ($SiO_2$), or an organic insulation material.

A third conductive layer is formed by sputtering, patterned by photolithography and etched, thereby forming the second signal line 201. The second signal line 201 can be formed of the same transparent conductive material as the pixel electrode. The transparent conductive material can be one of ITO (Indium Tin Oxide), IZO (Indium Zinc Oxide), ITZO (Indium Tin Zinc Oxide), and TO (Tin Oxide). However, in the case of a transflective (transmitting-reflective) type display device, the second signal line 201 can be formed of a reflective metal material which is the same material as a reflective electrode of display area.

Figure 5A:
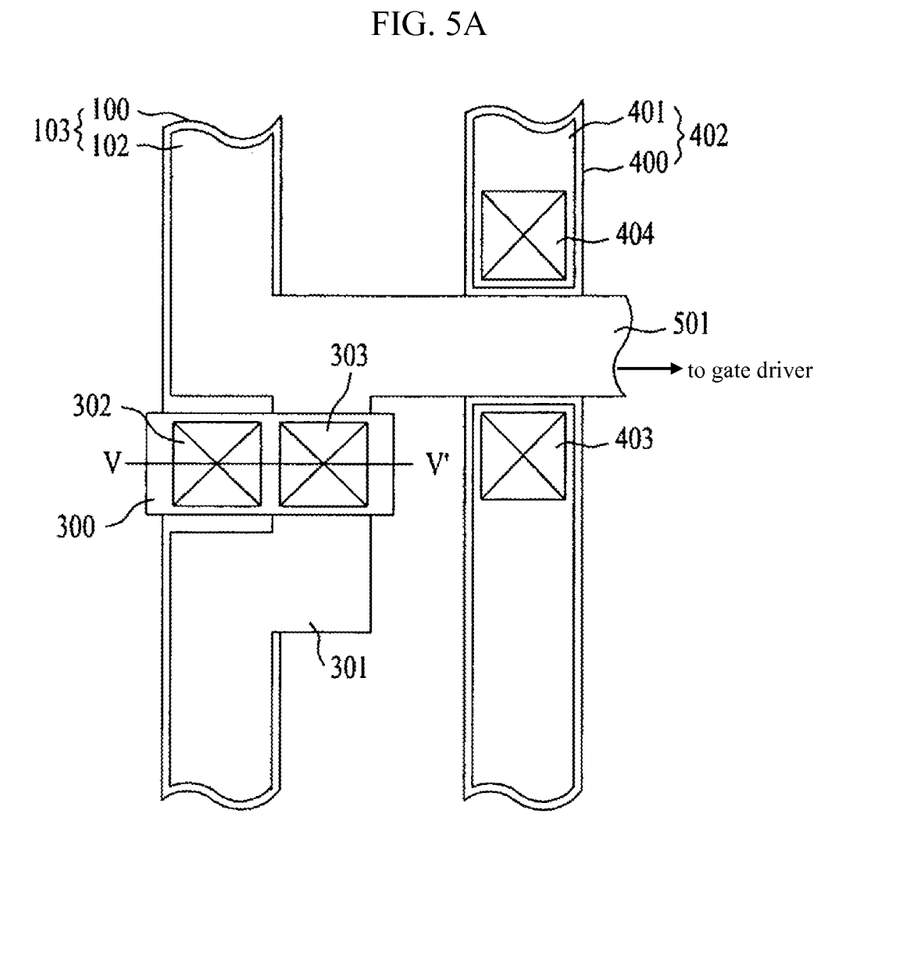
FIG. 5A is a plan view of illustrating another contact structures of signal lines according to an embodiment of the present invention.
Figure 5B:
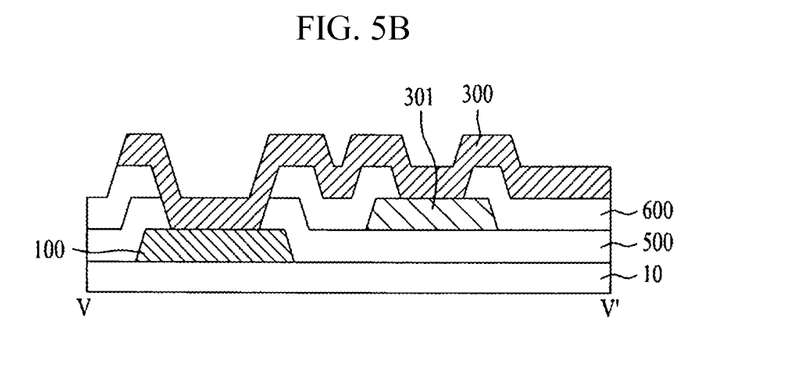
FIG. 5B is a cross-sectional view of signal lines along line V-V' of FIG. 5A.

FIG. 5A is a plan view of illustrating another contact structure of signal lines according to an embodiment of the present invention. FIG. 5B is a cross-sectional view of signal lines along line V-V' of FIG. 5A. As shown in FIGS. 5A and 5B, a first signal line 103 is formed of lower and upper lines 100 and 102 overlapping each other with a first insulation layer 500 interposed therebetween, a branch signal line 501 from the first signal line 103 is formed as an integral part of the upper line 102 of the first signal line 103; a second signal line 402 crosses under the branch signal line 501, and a contact electrode 300 electrically connects the lower and upper lines 100 and 102 through first and second contact holes 302 and 303.

A projection 301 is formed by the upper line 102 around a portion of the lower line 100. The portion of the lower line 100 is exposed by a first contact hole 302 and the upper line 102 is exposed by a second contact hole 303. The contact electrode 300 electrically connects the lower and upper lines 100 and 102 to each other through the first and second contact holes 302 and 303. More specifically, one end of the contact electrode 300 is electrically connected with the lower line 100 of first signal line 103 through the first contact hole 302 passing through the first and second insulation layers 500 and 600 while the other end of the contact electrode 300 is electrically connected with the projection 301 formed in the upper line 102 of first signal line 103 through the second contact hole 303 passing through the second insulation layer 600. Accordingly, the contact electrode 300 connects the lower and upper lines 100 and 102 of first signal line 103 in parallel. In the alternative, the lower and upper lines 100 and 102 may be directly connected to each other by welding without using the contact electrode 300.

The branch signal line 501 is formed as an integral part of the upper line 102 of first signal line 103, such that the branch second signal line 501 and the upper line 102 of first signal line 103 are formed of the same metal material. Thus, the branch signal line 501 extends from the upper line 102 of first signal line 103, and is also orthogonal to a second signal line 402 such that the branch signal line 501 can crossover the second signal line 402 and electrically connect to the gate driver.

The second signal line 402 crossing under the branch signal line 501 is provided with an upper line 401 that has a predetermined open portion, thereby preventing a short to the branch signal line 501. Even though an open portion is in the upper line 401 of the second signal line 402, the upper line 401 is electrically connected to the lower line 400 of the second signal line 402 through the contact points 403 and 404 such that a signal on the second signal line 402 can be carried under the branch signal line 501.

Although not shown, the lower lines of first and second signal lines are formed on the substrate of the same metal material at the same time. Accordingly, it is unnecessary to carry out additional process for forming the second signal line, thereby simplifying the fabrication process of display device.

A method of forming the contact structure of FIG. 5A will be explained with reference to FIG. 5B. First, a gate metal layer corresponding to a first conductive layer is deposited on the substrate 10 by sputtering, patterned by photolithography and etched, thereby forming the lower line 100.

Then, a gate insulation layer corresponding to a first insulation layer 500 is formed on the substrate 10 to cover the lower line 100 by plasma enhanced chemical vapor deposition (PECVD). The first insulation layer 500 is formed of an inorganic insulation material, such as silicon nitride (SiN) or silicon oxide (SiO2), or an organic insulation material.

Next, a data metal layer corresponding to a second conductive layer is deposited on first insulation layer 500 by sputtering, patterned by photolithography and etched, thereby forming the upper line 102 overlapping the lower line 100 with a projection 301 around a portion of the lower line 100.

The upper line 102 may be formed of a transparent conductive material, which is the same material as a pixel electrode in the display area on the substrate 10. The transparent conductive layer can be ITO, IZO, ITZO, or TO. In the case of a transflective (transmitting-reflective) type display device, the upper line 102 can be formed of a reflective metal layer that is the same as that of a reflective electrode of display area on the substrate 10.

A passivation layer corresponding to a second insulation layer 600 is then formed by a position method, such as PECVD, or a spinless coating method such that the passivation layer covers the upper line 102 and the projection 301. Then, the second insulation layer 600 is patterned by photolithography and etched, thereby forming first and second contact holes 302 and 303 to expose the projection 301 and the predetermined portion of upper line 102. The second insulation layer 600 can be formed an inorganic insulation material, such as silicon nitride (SiN) or silicon oxide (SiO$_2$), or an organic insulation material.

Then, a contact electrode layer corresponding to a third conductive layer is formed by sputtering, patterned by photolithography and etched, thereby forming the contact electrode 300. The contact electrode 300 electrically connects the lower line 100 and the projection 301 to each other.

Because the first signal line is formed in a dual-layered structure, including lower and upper lines electrically connected to each other, output signal properties are improved. Such a dual-layered structure prevents display device defects caused by disconnection of the first signal line. Further, a branch signal line can be formed at the same time as the upper line, thereby simplifying the fabrication process of a display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a substrate with a display area having gate lines and data lines defining cells that each has a pixel electrode;
   a driving circuit on the substrate;
   at least one first signal line including lower and upper lines overlapping each other with a first insulation layer interposed therebetween, the first signal line adjacent to and physically isolated from the driving circuit; and
   at least one second signal line to electrically connect the first signal line to the driving circuit,
   wherein the lower line further includes a projection extending from the side of the lower line,
   wherein the lower and upper lines are electrically connected to each other through the plurality of contact points by welding or forming contact holes in the first insulation layer,
   wherein the least one second signal line includes predetermined open portions,
   wherein the second signal line is electrically connected with the upper line of first signal line exposed by a first contact hole passing through a second insulation layer disposed over the first insulation layer, and
   wherein the second signal line is electrically connected with the projection formed in the lower line of first signal line exposed by a second contract hole passing through the first insulation layer and the second insulation layer, a portion of the second insulation layer being further disposed between the second signal line and the upper line.

2. The display device of claim 1, wherein the lower line is a same metal material and in a same layer as the gate lines.

3. The display device of claim 1, wherein the upper line is a same metal material and in a same layer as the data lines.

4. The display device of claim 1, wherein the second signal line is a same transparent material and in a same layer as the pixel electrodes.

5. A display device, comprising:
   a substrate with a display area having gate lines and data lines defining cells that each has a pixel electrode;
   a driving circuit on the substrate;
   at least one first signal line including a lower lines and an upper line overlapping each other with an insulation layer interposed therebetween, the upper line having an opening between portions of the upper line; and
   at least one second signal line crossing the lower line in the opening of the upper line to connect to the driving circuit, the lower line being physically isolated from the driving circuit, the at least one second signal line electrically connecting the lower line to the driving circuit,
   wherein the lower line further includes a projection extending from the side of the lower line, wherein the lower and upper lines are electrically connected to each other through the plurality of contact points by welding or forming contact holes in the first insulation layer, wherein the least one second signal line includes predetermined open portions, wherein the second signal line is electrically connected with the upper line of first signal line exposed by a first contact hole passing through a second insulation layer disposed over the first insulation layer, and wherein the second signal line if electrically connected with the projection formed in the lower line of first signal line exposed by a second contact hole passing through the first insulation layer and the second insulation layer, a portion of the second insulation layer being further disposed between the second signal line and the upper line.

6. A method of fabricating a display device with a display area on a substrate having gate lines and data lines defining cells that each has a pixel electrode, the method comprising:

forming at least one first signal line including lower and upper lines overlapping each other with a first insulation layer interposed therebetween; and forming at least one second signal line directly connected to the upper line and electrically connected to a driving circuit on the substrate, the lower line being physically isolated from the driving circuit, the lower line being electrically connected to the driving circuit via the at least one second signal line, wherein the lower line further includes a projection extending from the side of the lower line, wherein the lower and upper lines are electrically connected to each other through the plurality of contact points by welding or forming contact holes in the first insulation layer, wherein the least one second signal line includes predetermined open portions, wherein the second signal line is electrically connected with the upper line of first signal line exposed by a first contact hole passing through a second insulation layer disposed over the first insulation layer, and wherein the second signal line is electrically connected with the projection formed in the lower line of first signal line exposed by a second contact hole passing through the first insulation layer and the second insulation layer, a portion of the second insulation layer being further disposed between the second signal line and the upper line.

7. The method of claim 6, wherein forming the first signal line includes:

forming the lower line on a substrate;

forming the first insulation layer to cover the lower line on the substrate; and forming the upper line overlapping with the lower line on the first insulation layer.

8. The method of claim 7, wherein the second signal line is formed integral with the upper line as a branch from the first signal line.

9. A method of fabricating a display device with a display area on a substrate having gate lines and data lines defining cells that each has a pixel electrode, the method comprising:

forming at least one first signal line including a lower lines and an upper line overlapping each other with a first insulation layer interposed therebetween, the upper line having a predetermined opening between portions of the upper line; and forming at least one second signal line crossing the lower line in the opening of the upper line to connect to the driving circuit, the lower line being physically isolated from the driving circuit, the at least one second signal line electrically connecting the lower line to the driving circuit, wherein the lower line further includes a projection extending from the side of the lower line, wherein the lower and upper lines are electrically connected to each other through the plurality of contact points by welding or forming contact holes in the first insulation layer, wherein the least one second signal line includes predetermined open portions, wherein the second signal line is electrically connected with the upper line of first signal line exposed by a first contact hole passing through a second insulation layer disposed over the first insulation layer, and wherein the second signal line is electrically connected with the projection formed in the lower line of first signal line exposed by a second contact hole passing through the first insulation layer and the second insulation layer, a portion of the second insulation layer being further disposed between the second signal line and the upper line.

* * * * *